(12) United States Patent
Cho et al.

(10) Patent No.: US 11,990,559 B2
(45) Date of Patent: May 21, 2024

(54) METHOD OF MANUFACTURING MICRO-LIGHT EMITTING DIODE-BASED DISPLAY AND MICRO-LIGHT EMITTING DIODE-BASED DISPLAY

(71) Applicant: KOREA ADVANCED INSTITUTE OF SCIENCE AND TECHNOLOGY, Daejeon (KR)

(72) Inventors: Yong-Hoon Cho, Daejeon (KR); Young Chul Sim, Daejeon (KR)

(73) Assignee: KOREA ADVANCED INSTITUTE OF SCIENCE AND TECHNOLOGY (KR)

( * ) Notice: Subject to any disclaimer, the term of this patent is extended or adjusted under 35 U.S.C. 154(b) by 597 days.

(21) Appl. No.: 17/025,527

(22) Filed: Sep. 18, 2020

(65) Prior Publication Data

US 2021/0143299 A1    May 13, 2021

(30) Foreign Application Priority Data

Nov. 12, 2019   (KR) .................. 10-2019-0144340
Apr. 6, 2020    (KR) .................. 10-2020-0041605

(51) Int. Cl.
  *H01L 33/00*   (2010.01)
  *H01L 25/075*  (2006.01)

(52) U.S. Cl.
  CPC ...... *H01L 33/0095* (2013.01); *H01L 25/0753* (2013.01); *H01L 2933/0058* (2013.01); *H01L 2933/0066* (2013.01)

(58) Field of Classification Search
  CPC ............ H01L 33/0095; H01L 25/0753; H01L 2933/0058; H01L 2933/0066; H01L 27/156

See application file for complete search history.

(56) References Cited

U.S. PATENT DOCUMENTS

| | | | | |
|---|---|---|---|---|
| 2008/0136334 | A1* | 6/2008 | Robinson | H05B 47/18 |
| | | | | 315/363 |
| 2014/0264254 | A1* | 9/2014 | Kim | H01L 33/38 |
| | | | | 257/9 |
| 2014/0353705 | A1* | 12/2014 | Kamikawa | H01L 21/268 |
| | | | | 257/98 |
| 2015/0207038 | A1* | 7/2015 | Hwang | H01L 33/405 |
| | | | | 257/88 |

(Continued)

FOREIGN PATENT DOCUMENTS

| | | |
|---|---|---|
| JP | 2017157724 A | 9/2017 |
| KR | 101322927 B1 | 10/2013 |

(Continued)

*Primary Examiner* — Ratisha Mehta
(74) *Attorney, Agent, or Firm* — Heslin Rothenberg Farley & Mesiti P.C.

(57) ABSTRACT

A method of manufacturing a micro-light emitting diode (LED)-based display, and a micro-LED-based display are provided. The method includes forming a micro-LED partitioned in the unit of a plurality of sub-pixels on a semiconductor substrate, planarizing the micro-LED by forming a planarization layer on at least a portion of the micro-LED, forming a via hole in the planarization layer, and integrating the micro-LED and a thin-film transistor (TFT) for an operation of the sub-pixels by arranging and depositing the TFT on the planarized micro-LED.

17 Claims, 10 Drawing Sheets

(56) References Cited

U.S. PATENT DOCUMENTS

| | | | | |
|---|---|---|---|---|
| 2016/0293586 A1* | 10/2016 | Ghosh | ................ | H01L 29/7869 |
| 2017/0062653 A1* | 3/2017 | Huang | .................... | H01L 33/06 |
| 2019/0198715 A1* | 6/2019 | Lim | ....................... | H01L 33/42 |
| 2019/0244937 A1 | 8/2019 | Honjo et al. | | |
| 2021/0336095 A1* | 10/2021 | Chen | .................... | H01L 33/005 |
| 2021/0343902 A1* | 11/2021 | Hoeppl | .................. | H01L 33/22 |

FOREIGN PATENT DOCUMENTS

| | | |
|---|---|---|
| KR | 20130139113 A | 12/2013 |
| KR | 20180052977 A | 5/2018 |
| KR | 101880721 B1 | 7/2018 |
| KR | 20180118488 A | 10/2018 |
| KR | 20190044492 A | 4/2019 |
| KR | 20190077789 A | 7/2019 |

\* cited by examiner

METHOD OF MANUFACTURING MICRO-LIGHT EMITTING DIODE-BASED DISPLAY AND MICRO-LIGHT EMITTING DIODE-BASED DISPLAY

CROSS-REFERENCE TO RELATED APPLICATION(S)

This application claims the priority benefit of Korean Patent Application No. 10-2019-0144340, filed on Nov. 12, 2019, and Korean Patent Application No. 10-2020-0041605, filed on Apr. 6, 2020, in the Korean Intellectual Property Office, the disclosures of which are incorporated herein by reference for all purposes.

BACKGROUND

1. Field

One or more example embodiments relate to a method of manufacturing a micro-light emitting diode (LED)-based display, and a micro-LED-based display.

2. Description of Related Art

Displays have been developed based on technologies of liquid crystal displays (LCDs) and organic lighting emitting diodes (OLEDs).

However, since LCDs are not self-emissive devices, other devices (for example, polarizing films, or backlight units) are required. Organic material-based OLEDs are self-emissive devices, but a light emission efficiency is less than that of an inorganic semiconductor, or durability is weak because OLEDs are easily oxidized in a usage environment.

When a display constituting each pixel is manufactured using an inorganic semiconductor-based light emitting diode (LED), the above-described issues of LCDs and OLED-based displays may be solved all at once. An LED has a light emission efficiency higher than other light emitting devices, and is a self-emissive device that may realize various colors. Also, the LED has strong durability against the environment because the LED is based on inorganic materials. For this reason, a display constituting each sub-pixel using a micro-sized LED, that is, a micro-LED-based display is being spotlighted as an ideal display.

In micro-LED-based display technology developed thus far, a process of individually transferring respective micro-sized LEDs (for example, red, green, and blue LEDs) on a display panel substrate is used. An individual transferring process of directly transferring extremely small and many micro-LEDs requires minute and precise technology, and a difficulty level of a process of manufacturing a display may increase due to complexity thereof. Due to such a complex two-step process, a difficulty in reducing a manufacturing cost may occur, which may lead to many difficulties in commercialization.

SUMMARY

One or more example embodiments are to solve the above-mentioned problems, and an aspect provides a method of manufacturing a micro-light emitting diode (LED)-based display by forming a multi-wavelength light emitter of a three-dimensional (3D) structure on a single substrate using a single process and by integrating a thin-film transistor (TFT) on the same substrate through a series of processes, to manufacture the micro-LED-based display without needing to perform a complex transferring process.

Also, another aspect provides an actively operating micro-LED-based display that may be manufactured by the above method, and that may implement a full color display and a configuration of micro-LEDs of various light emitting regions.

However, problems to be solved by the present disclosure are not limited to the above-described problems, and other problems not mentioned herein can be clearly understood by those skilled in the art from the following description.

According to an example embodiment, there is provided a method of manufacturing a micro-LED-based display, the method including forming a micro-LED partitioned in the unit of a plurality of sub-pixels on a semiconductor substrate, planarizing the micro-LED by forming a planarization layer on at least a portion of the micro-LED, forming a via hole in the planarization layer, and integrating the micro-LED and a thin-film transistor (TFT) for an operation of the sub-pixels by arranging and depositing the TFT on the planarized micro-LED.

The forming of the micro-LED may include forming a micro-LED partitioned in the unit of sub-pixels on at least a portion of a single substrate or over the entire single substrate through a single process.

The forming of the micro-LED may include forming a 3D light emitting structure by being partitioned in the unit of sub-pixels on an n-type semiconductor layer, and forming a p-type semiconductor layer on the 3D light emitting structure.

The forming of the 3D light emitting structure may include forming a 3D structure on the n-type semiconductor layer, and forming a light emitting layer configured to emit broadband light or light emitting layers configured to emit light with at least two different wavelengths on the 3D structure.

The forming of the 3D structure on the n-type semiconductor layer may include forming a mask layer on the n-type semiconductor layer, patterning the mask layer, and forming structures having various shapes, sizes or distances by etching or growing the n-type semiconductor layer.

The forming of the p-type semiconductor layer may include forming the p-type semiconductor layer on the 3D light emitting structure or forming the p-type semiconductor layer so that the 3D light emitting structure is buried. The p-type semiconductor layer may have a thickness of 100 nanometers (nm) to 2 micrometers (μm).

A wavelength of light emitted from the 3D light emitting structure may be adjusted by at least one of shapes, sizes and arrangement intervals of 3D structures. The sub-pixels may include 3D light emitting structures configured to emit light having identical wavelengths or different wavelengths.

The sub-pixels may emit at least one of red, green and blue lights, and may be formed with polychromatic wavelength micro-LEDs.

The sub-pixels may emit white light, light having a broadband wavelength, or both.

The method may further include forming a leakage current blocking layer on at least a portion of the micro-LED, and forming a current spreading layer on the portion of the micro-LED on which the leakage current blocking layer is formed. The leakage current blocking layer may be formed on a p-type semiconductor layer of the micro-LED, and may be formed to expose an upper region of the micro-LED.

The current spreading layer may be formed on the leakage current blocking layer and the p-type semiconductor layer.

The leakage current blocking layer may include at least one of a spin-on glass (SOG) material, metal, oxide, and a nitride insulting material, and may be transparent to visible light.

The method may further include forming a current spreading layer on the micro-LED. The planarizing of the micro-LED may include planarizing the micro-LED by forming a planarization layer on at least a portion of the micro-LED on which the current spreading layer is formed. The forming of the current spreading layer on the micro-LED may include depositing a transparent electrode, a metal electrode, or both on the micro-LED.

The current spreading layer may be formed on a p-type semiconductor layer of the micro-LED.

The current spreading layer may have a thickness of 1 nm to 500 nm, and may be formed as a single layer or a plurality of layers.

The current spreading layer may include a transparent electrode layer with a thickness of 1 nm to 500 nm, a metal electrode layer with a thickness of 1 nm to 50 nm, or both.

The planarizing of the micro-LED may include depositing an insulating layer including at least one of an organic material, oxide, nitride, and metal in a region in which a TFT is integrated among micro-LED regions in which the current spreading layer is formed, and performing planarization.

The planarization layer may include at least one of an SOG material, metal, oxide, and a nitride insulting material, and may be transparent to visible light.

The forming of the via hole in the planarization layer may include forming a via hole in an upper region or a side of the micro-LED, a via hole may be formed to a depth at which a current spreading layer is exposed, and a drain region of the TFT may contact the current spreading layer through the via hole.

The forming of the micro-LED, and the integrating of the micro-LED and the TFT may be performed on a same semiconductor substrate. The method may be free of a transferring process between the forming of the micro-LED, and the integrating of the micro-LED and the TFT.

The method may further include depositing a color filter corresponding to each of the sub-pixels.

According to an example embodiment, there is provided a micro-LED-based display including a sub-pixel configured to emit white light, or light having a broadband wavelength, and a color filter corresponding to the sub-pixel. The micro-LED-based display may actively operate through a TFT.

The micro-LED-based display may include a sub-pixel configured to emit at least one of red, green and blue lights. The micro-LED-based display may be based on a polychromatic wavelength micro-LED.

Additional aspects of example embodiments will be set forth in part in the description which follows and, in part, will be apparent from the description, or may be learned by practice of the disclosure.

According to example embodiments, through a single process, multi-wavelength micro-LEDs may be formed on a same substrate, an active matrix device for an active operation may also be manufactured on the same substrate, and an actively operating display may be manufactured without a transferring process, and thus it is possible to simplify a process of manufacturing a micro-LED-based display and to realize a mass production.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Hereinafter, example embodiments will be described in detail with reference to the accompanying drawings. When it is determined detailed description related to a related known function or configuration they may make the purpose of the present disclosure unnecessarily ambiguous in describing the present disclosure, the detailed description will be omitted here. Also, terminologies used herein are defined to appropriately describe the example embodiments of the present disclosure and thus may be changed depending on a user, the intent of an operator, or a custom of a field to which the present disclosure pertains. Accordingly, the terminologies must be defined based on the following overall description of the present specification. The same reference numerals as shown in each drawing represent same elements.

Throughout the specification, when any element is positioned "on" the other element, this not only includes a case that the any element is brought into contact with the other element, but also includes a case that another element exists between two elements.

Throughout the specification, if a prescribed part "includes" a prescribed element, this means that another element can be further included instead of excluding other elements unless any particularly opposite description exists.

Hereinafter, a method of manufacturing a micro-light emitting diode (LED)-based display and a micro-LED-based display will be described in detail with reference to example embodiments and drawings. However, the present disclosure is not limited to the example embodiments and drawings.

The present disclosure relates to a method of manufacturing a micro-LED-based display. According to an example embodiment, through a single process, an actively operating micro-LED-based display that may have various wavelength regions, that may form multi-wavelength micro-LEDs on a same substrate, and that may also manufacture an active matrix device for an active operation on the same substrate.

Figure 1:
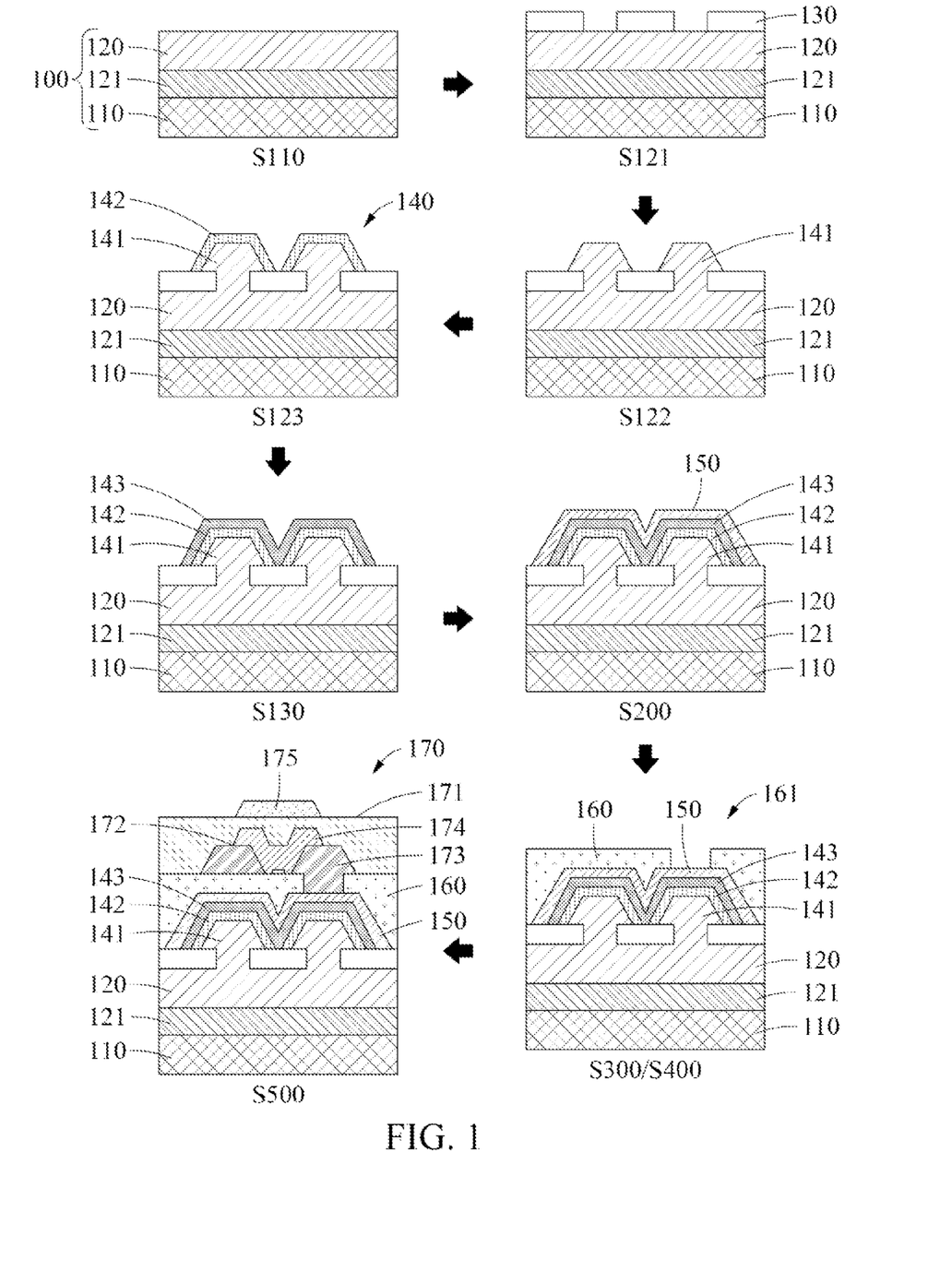
FIG. 1 illustrates an example of a method of manufacturing a micro-light emitting diode (LED)-based display according to an example embodiment.

According to an example embodiment, referring to FIG. 1, a method of manufacturing a micro-LED-based display may include step S100 of forming a micro-LED, step S300 of performing planarization, step S400 of forming a via hole, and step S500 of integrating the micro-LED and a thin-film transistor (TFT) circuit. The method may further include step S200 of forming a current spreading layer on the micro-LED.

Step S100 may be a step of forming a micro-LED partitioned in the unit of a plurality of sub-pixels in a micro-LED region on a substrate. Step S100 may include step S110 of preparing a semiconductor substrate, step S120 of forming a three-dimensional (3D) light emitting structure, and step S130 of forming a p-type semiconductor layer.

Step S110 may be a step of preparing a semiconductor substrate 100 to operate a display and to form a micro-LED. For example, the semiconductor substrate 100 may include a substrate 110, and a semiconductor layer 120 formed on the substrate 110.

The substrate 110 may be properly selected based on a field of application of the micro-LED, and may include, but is not limited to, for example, at least one of sapphire ($Al_2O_3$), Si, SiC, GaN, GaAs, and AlN. Desirably, the substrate 110 may be a sapphire ($Al_2O_3$) substrate or a Si substrate.

The semiconductor layer 120 may be divided into a micro-LED region partitioned in the unit of sub-pixels, and a TFT region. Positions and sizes of the above regions and an interval between the regions may be designed for operation of the micro-LED and the display.

The semiconductor layer 120 may include an n-type gallium nitride semiconductor. The n-type gallium nitride semiconductor may include, but is not limited to, for example, at least one selected from the group consisting of GaN, InGaN, GaNP, GaNAs, GaNSb, AlGaN, BAlGaN, GaAlNP, GaAlNAs, InAlGaN, GaAlNSb, GaInNP, GaInNAs, and GaInNSb. An n-type gallium nitride semiconductor may further include an n-type impurity element, and the n-type impurity element may include, but is not limited to, for example, at least one selected from the group consisting of N, P, As, Ge, Si, Cu, Ag, Au, Sb, and Bi.

The semiconductor layer 120 may be formed with a thickness of 500 nanometers (nm) to 5 micrometers ($\mu m$), and may have, for example, a thickness of 2 $\mu m$ to 4 $\mu m$. When the thickness of the semiconductor layer 120 is less than 500 nm, a quality of a micro-LED device may not be sufficiently good. When the thickness of the semiconductor layer 120 is greater than 5 $\mu m$, a semiconductor substrate layer may crack.

The semiconductor substrate 100 may further include a buffer layer 121 between the substrate 110 and the semiconductor layer 120. The buffer layer 121 may include a U-type gallium nitride semiconductor. The buffer layer 121 may be used to eliminate a lattice mismatch between a substrate and a nitride semiconductor material and a difference in a thermal expansion coefficient between the substrate and the nitride semiconductor material. As the buffer layer 121, undoped GaN (U-GaN), high-temperature or low-temperature growth U-GaN, a low-temperature growth GaN layer, or an AlN layer may be used, and the U-GaN may desirably be used. The buffer layer 120 may be formed with a thickness of 10 nm to 1 $\mu m$.

The semiconductor substrate 100 may have a small area or a large area, and may have, for example, a wafer-level large area of 2 inches or greater, 5 inches or greater, 8 inches or greater, or 12 inches or greater.

The semiconductor layer 120 be formed using a vapor deposition scheme, such as metal organic chemical vapor deposition (MOCVD), molecular beam epitaxy (MBE), or hydride vapor phase epitaxy (HVPE). For example, the n-type nitride semiconductor layer may be formed under a condition of a temperature of 850° C. to 1100° C. and a pressure of 50 torr to 500 torr.

Step S120 may include step S121 of patterning a mask layer on the semiconductor layer, step S122 of forming a 3D structure, and step S123 of forming a light emitting layer.

Step S121 may be a step of forming a mask layer on the semiconductor layer 120 and pattering the mask layer to form a patterned mask layer 130 having openings (or holes). The mask layer 130 may be patterned by being partitioned into a plurality of sub-pixels on the micro-LED region of the semiconductor layer 120, and a 3D structure 141 may be formed on the semiconductor layer 120 using the mask layer 130. Thus, light emitting sources of the micro-LED-based display may be provided on the same substrate through a single process without a transferring process.

A shape and a size of the 3D structure, and a configuration of a light emitting layer of the 3D structure may be adjusted based on sizes, diameters or widths of the openings (or holes) of the patterned mask layer 130 and arrangement intervals (for example, center-to-center distances between the openings) of the openings (or holes). Also, a wavelength of light emitted from the 3D light emitting structure may be minutely adjusted.

Step S122 may be a step of forming a plurality of 3D structures 141 on the semiconductor layer 120 using the mask layer 130 in the sub-pixels of the micro-LED region. A wavelength of light emitted from a 3D light emitting structure 140 may be adjusted by changing at least one factor among shapes, sizes (for example, heights, volumes, cross sectional areas, diameters, lengths, or lengths of base faces), components, arrangement manners (for example, center-to-center distances, arrangement shapes, or densities), growth schemes, and crystal structures of the 3D structures 141. Also, by changing values greater than or equal to "2" of the above factors, the shapes, or both, the wavelength of light emitted from the 3D light emitting structure 140 may be adjusted, or the 3D light emitting structure 140 may be partitioned into sub-pixels.

To implement a desired wavelength band and/or a single wavelength band or various wavelength bands (for example, a full color display), the sub-pixels may have a plurality of 3D structures that are the same or different from each other, or a plurality of 3D structures that emit light having wavelengths that are the same or different from each other. Finally, wavelengths of light to be emitted may be distinguished in the unit of sub-pixels.

The 3D structure 141 may be a structure continuous with the semiconductor layer 120, or may include the same semiconductor material as the semiconductor layer 120. The 3D structure 141 may be formed through etching or growth via the openings (or holes) of the mask layer 130 patterned on the semiconductor layer 120. For example, referring to FIG. 2, the patterned mask layer 130 may be formed on substrate/u-GaN/n-GaN layers. A 3D structure n-GaN may be grown using a "bottom-up" scheme within the openings (or holes) of the patterned mask layer 130, or may be formed by etching using a "top-down" scheme.

Figure 2:
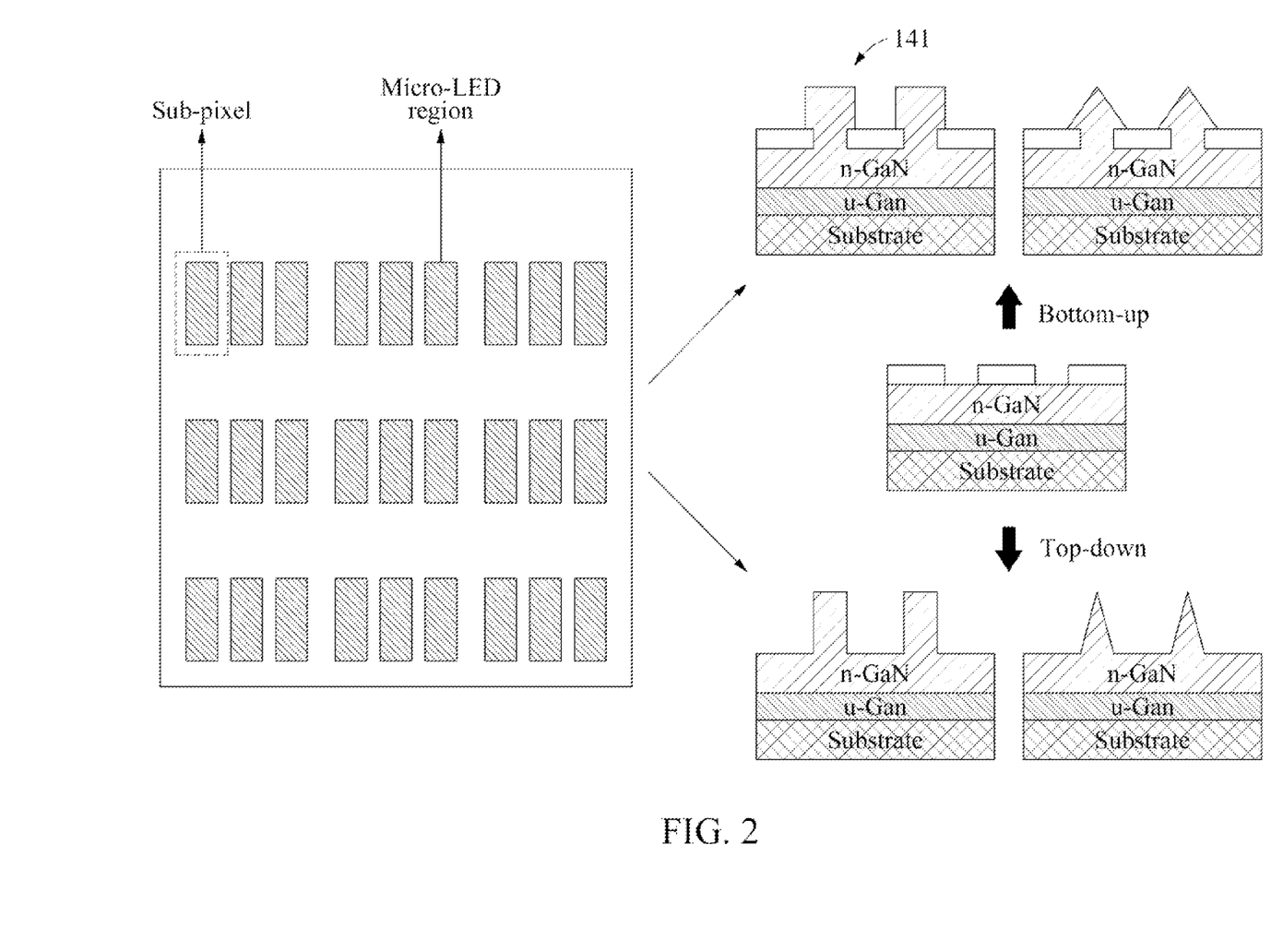
FIG. 2 illustrates an example of a step of forming a three-dimensional (3D) structure in a method of manufacturing a micro-LED-based display according to an example embodiment.

For example, in the "bottom-up" scheme, growing may be performed at a temperature of 900° C. to 1150° C. and a pressure of 50 torr to 500 torr, and MOCVD, MBE, or HVPE may be used. Also, in the "top-down" scheme, physical or chemical etching may be used.

The 3D structure 141 may include at least one selected from the group consisting of structures with a cone; a polygonal pyramid; a cylinder; a polygonal prism; a circular ring; polygonal ring; a hemisphere; a cone, a polygonal pyramid, a circular ring, and a polygonal ring truncated to have flat tops; a cone, a polygonal pyramid and a polygonal prism including cylindrical hollows; and a line-shaped prism.

Step S123 may be a step of forming a light emitting layer 142 on the 3D structure 141 to form the 3D light emitting structure 140. The 3D light emitting structure 140 may be a structure connected to the semiconductor layer to emit light of a single wavelength band or various wavelength bands.

Figure 3:
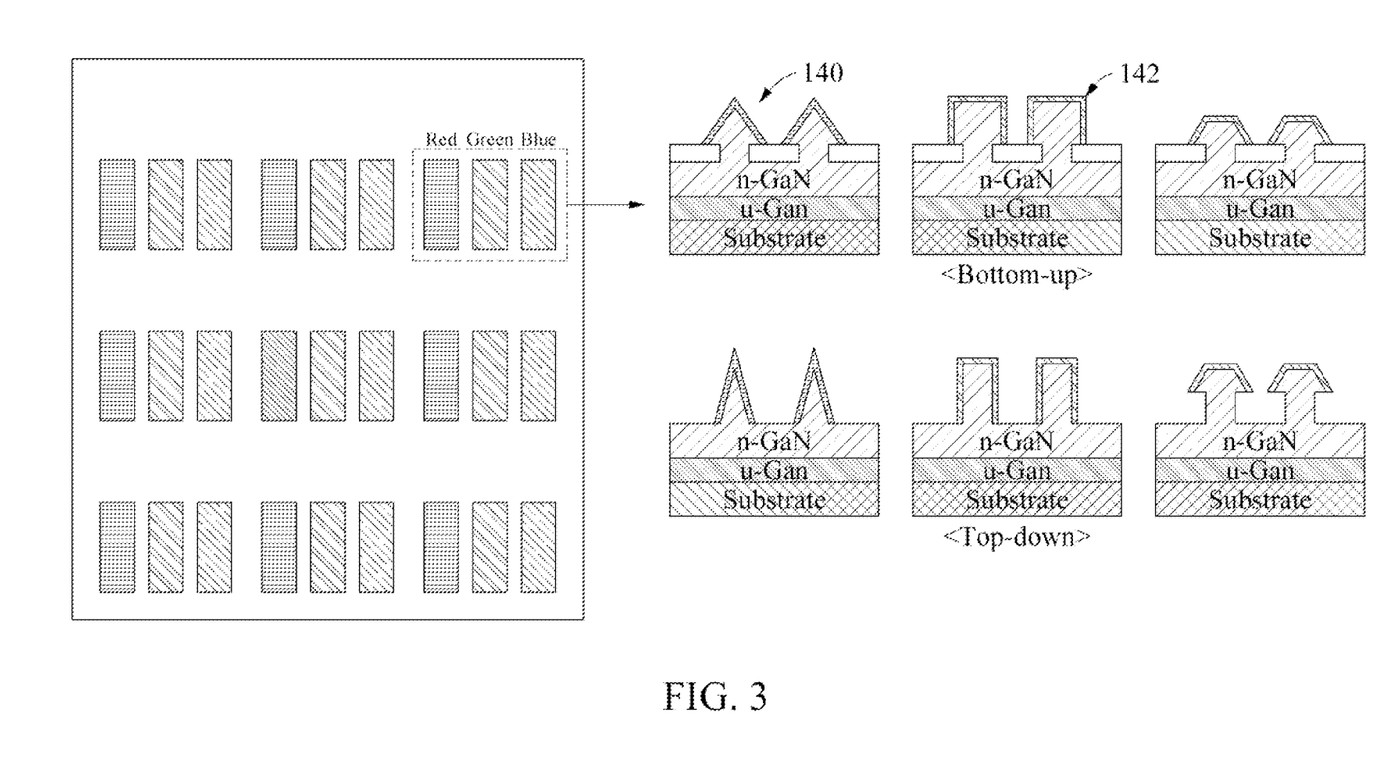
FIG. 3 illustrates an example of a step of forming a light emitting layer in a method of manufacturing a micro-LED-based display according to an example embodiment.

Since the light emitting layer 142 is formed along a surface of the 3D structure 141, the 3D light emitting structure 140 may have substantially the same size, the same shape and the same arrangement interval (shape) as the 3D structure 141. A wavelength of light emitted from the 3D light emitting structure 140 may be adjusted by at least one factor among shapes, sizes (for example, heights, volumes, cross sectional areas, diameters, lengths, or lengths of base faces), components, arrangement manners (for example, center-to-center distances, arrangement shapes, or densities), growth schemes, and crystal structures of the 3D structures 141. In addition, the wavelength of light emitted from the 3D light emitting structure 140 may be further adjusted by a configuration of the light emitting layer 142. For example, as shown in FIG. 3, wavelengths of light to be emitted may be distinguished in the unit of sub-pixels, shapes and sizes of 3D structures 141 in sub-pixels and/or intervals between the 3D structures 141 may be adjusted, and sub-pixels divided into light emitting regions of various wavelengths such as visible light (red, green, and blue), white light, or light having a broadband wavelength may be formed.

The 3D light emitting structure 140 may have a diameter (or a length of a base face) of 50 nm to 30 μm, and/or a height (or a length) of 50 nm to 10 μm. When the height of the 3D light emitting structure 140 increases, a wavelength of light emitted from the 3D light emitting structure 140 may increase.

3D light emitting structures 140 may be arranged to have center-to-center distances of 10 nm to 50 μm. In other words, the center-to-center distances of the 3D light emitting structures 140 may correspond to center-to-center distances of openings formed in a patterned mask layer. When the center-to-center distances of the 3D light emitting structures 140 increase, wavelengths of light emitted from the 3D light emitting structures 140 may increase.

The light emitting layer 142 may be an active layer that includes a light emitting material and formed as a single layer or a plurality of layers. The light emitting layer 142 may adjust a wavelength of light to be emitted, by adjusting a thickness, a growth rate, a concentration ratio and migration of constituents, or a number of layers. For example, to adjust a wavelength of light to be emitted, the light emitting layer 142 may change at least one selected from the group consisting of a thickness of an active layer, a growth rate, a concentration ratio and migration of constituents, and a number of layers, based on a surface, for example, a side face (or an inclined surface) or a top surface, of the 3D structure 141. For example, as shown in FIG. 3, when an InGaN/GaN light emitting layer is formed, a wavelength of light to be emitted may change based on a shape of the 3D structure 141. Also, to adjust a wavelength of light to be emitted, an In-migration level in the light emitting layer 142 may be adjusted when the light emitting layer 142 is being grown on the 3D structure 141.

Figure 4A:
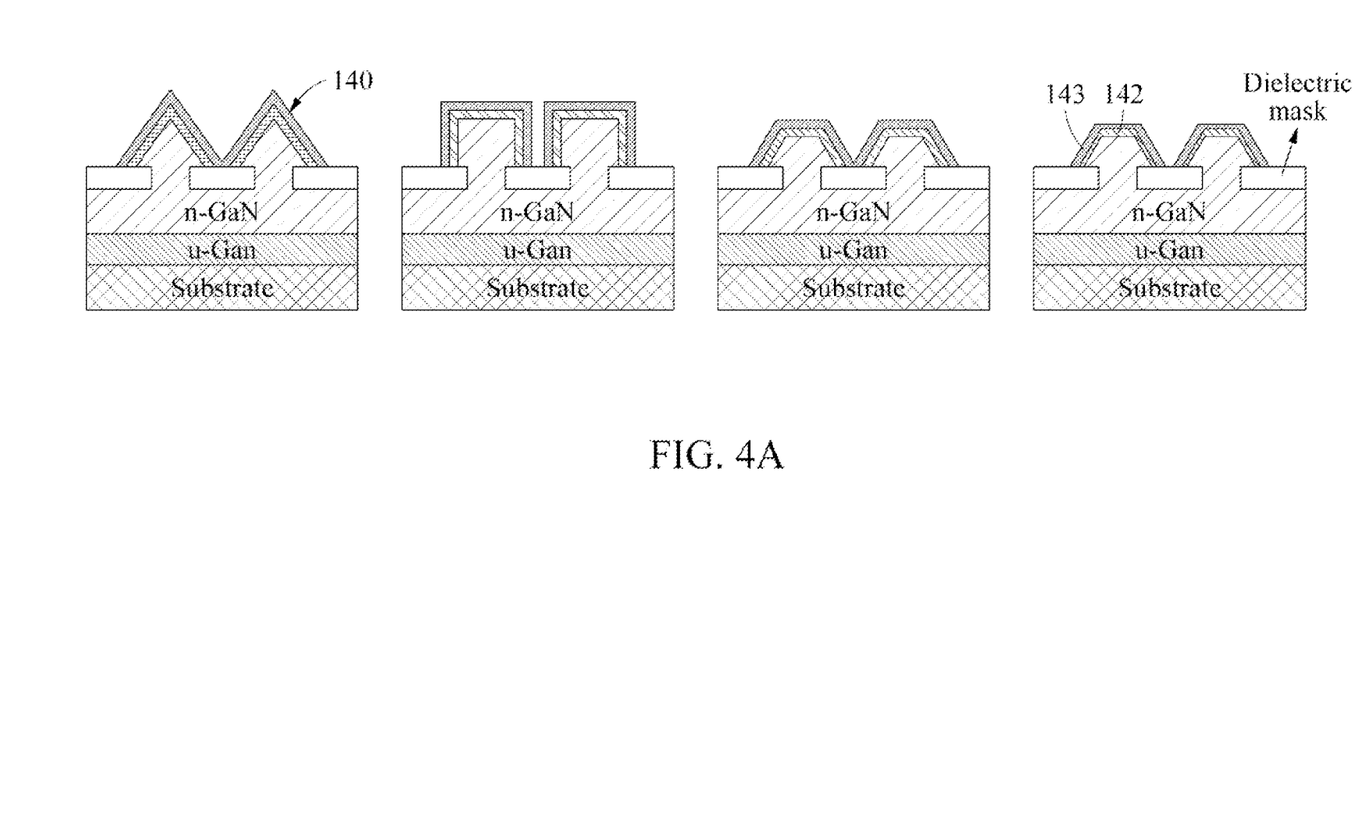
FIGS. 4A and 4B illustrate an example of a step of forming a p-type semiconductor layer in a method of manufacturing a micro-LED-based display, and an example of a shape of the p-type semiconductor layer according to an example embodiment.
Figure 4B:
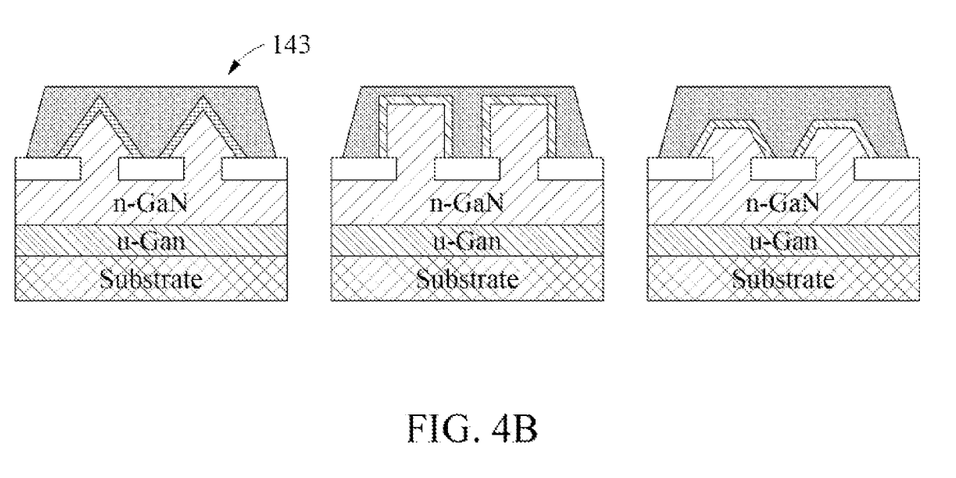

The light emitting layer 142 may have a quantum well structure, for example, a multi-quantum well (MQW) structure. The light emitting layer 142 may include at least one selected from the group consisting of GaN, GaNP, GaNAs, GaNSb, AlGaN, BAlGaN, GaAlNP, GaAlNAs, InAlGaN, GaAlNSb, GaInNP, GaInNAs, and GaInNSb, and may desirably include InGaN, or InGaN/GaN. The light emitting layer 142 may be formed with a thickness of 2 nm to 100 nm, and formed as a single layer or a plurality of layers. Also, as shown in FIG. 4, the thickness of the light emitting layer 142 may vary depending on a shape of the 3D structure 141 and a position in the 3D structure 141.

When a plurality of light emitting layers 142 are formed, an epi layer-based LED active layer, such as a superlattice layer, may be further included. By inserting the superlattice layer, emission of light with a long wavelength may be induced. For example, the superlattice layer may be formed as a single layer or a plurality of layers, and may include a quantum well layer.

The light emitting layer 142 may use MOCVD, MBE, or HVPE, and a process condition of a temperature of 500° C. to 850° C. and a pressure of 50 torr to 5500 torr. A range of the temperature may be properly selected based on a desired growth rate of a light emitting layer. Also, to form an effective light emitting structure, a process of forming an epi layer-based LED active layer, such as a superlattice layer, may be applied.

Step S130 may be a step of forming a p-type semiconductor layer on a 3D light emitting structure. As shown in FIGS. 4A and 4B, a p-type semiconductor layer 143 may be formed on at least a portion of the 3D light emitting structure 140 along a surface of the 3D light emitting structure 140, or may be formed so that the 3D light emitting structure 140 may be buried. Also, a thickness of the p-type semiconductor layer 143 may vary depending on the 3D light emitting structure 140.

The p-type semiconductor layer 143 may include a p-type gallium nitride semiconductor. For example, the p-type gallium nitride semiconductor may include at least one selected from the group consisting of GaN, GaNP, GaNAs, GaNSb, AlGaN, InGaN, BAlGaN, GaAlNP, GaAlNAs, InAlGaN, GaAlNSb, GaInNP, GaInNAs, and GaInNSb, and may desirably include p-type GaN including an AlGaN electron blocking layer. Also, the p-type semiconductor layer 143 may further include a p-type impurity element, and the p-type impurity element may be, for example, Mg, B, In, Ga, Al, or Tl.

The p-type semiconductor layer 143 may have a thickness of 100 nm to 2 μm, for example, a thickness of 100 nm to 2 μm, of 200 nm to 2 μm, of 400 nm to 2 of 500 nm to 2 μm, of 550 nm to 2 μm, of 600 nm to 1 μm, of or 700 nm to 1 μm. When the p-type semiconductor layer 143 is formed to be thin at a level of several tens of nanometers, it may be difficult to form a high-quality thin film. When the thickness of the p-type semiconductor layer 143 is 2 μm or greater, resistance may increase. Referring to FIG. 4A, the p-type semiconductor layer 143 may be formed to be thin at a level of nanometers based on a shape of a light emitting structure under the p-type semiconductor layer 143. When the p-type semiconductor layer 143 is formed to be thick at a level of several micrometers, a cross-sectional shape of the light emitting structure may be buried in the p-type semiconductor layer, and the p-type semiconductor layer 143 may have a flat top surface. When the p-type semiconductor 143 having the flat top surface is formed, step S300 may be omitted. In other words, at the same time or after formation of the p-type semiconductor layer, an insulating layer and a via hole may be formed, a current spreading layer may be formed, and a TFT may be integrated.

In step S130, MOCVD, MBE, or HVPE may be used.

Step S200 may be a step of depositing a current spreading layer 150 including a transparent electrode, a metal electrode, or both, on at least a portion or all of the micro-LED on which the p-type semiconductor layer 143 is formed. The current spreading layer 150 may be expanded to a TFT region and a sub-pixel including the micro-LED, to electrically connect 3D light emitting structures 140, and to be electrically connected to a TFT during depositing of the TFT onto the current spreading layer 150 so that current may flow into the TFT.

The current spreading layer 150 may include, for example, transparent semiconductor oxide, nitride, metal, poly(3,4-ethylenedioxythiophene) (PEDOT), a carbon nanotube (CNT), or graphene.

The metal electrode may include at least one selected from the group consisting of Co, Ir, Ta, Cr, Mn, Mo, Tc, W, Re, Fe, Sc, Ti, Sn, Ge, Sb, Al, Pt, Ni, and Au. The transparent electrode may include transparent semiconductor oxide, and may include, but is not limited to, for example, at least one selected from the group consisting of fluorine-doped tin oxide (FTO, $SnO_2$:F), indium tin oxide (ITO), indium zinc oxide (IZO), indium gallium zinc oxide (IGZO), Al-doped ZnO (AZO), aluminum gallium zinc oxide (AGZO), Ga-doped ZnO (GZO), indium zinc tin oxide (IZTO), indium aluminum zinc oxide (IAZO), indium gallium tin oxide (IGTO), antimony tin oxide (ATO), gallium zinc oxide (GZO), IZO nitride (IZON), cadmium stannate (CTO), $SnO_2$, ZnO, IrOx, RuOx, and NiO.

The current spreading layer 150 may be a single layer or a plurality of layers, and may be an n-type electrode and/or a p-type electrode. The current spreading layer 150 may have a thickness of 1 nm to 500 nm. For example, the current spreading layer 150 may include a transparent electrode layer having a thickness of 1 nm to 500 nm, a metal electrode layer having a thickness of 1 nm to 50 nm, or both. For example, the transparent electrode layer may have a thickness of 1 nm to 500 nm, 10 nm to 400 nm, 20 nm to 300 nm, 30 nm to 300 nm, 50 nm to 300 nm, or 50 nm to 200 nm. The metal electrode layer may have a thickness of 1 nm to 100 nm, 1 nm to 80 nm, 1 nm to 60 nm, 1 nm to 50 nm, 1 nm to 30 nm, 1 nm to 20 nm, 1 nm to 10 nm, or 1 nm to 5 nm.

Figure 5:
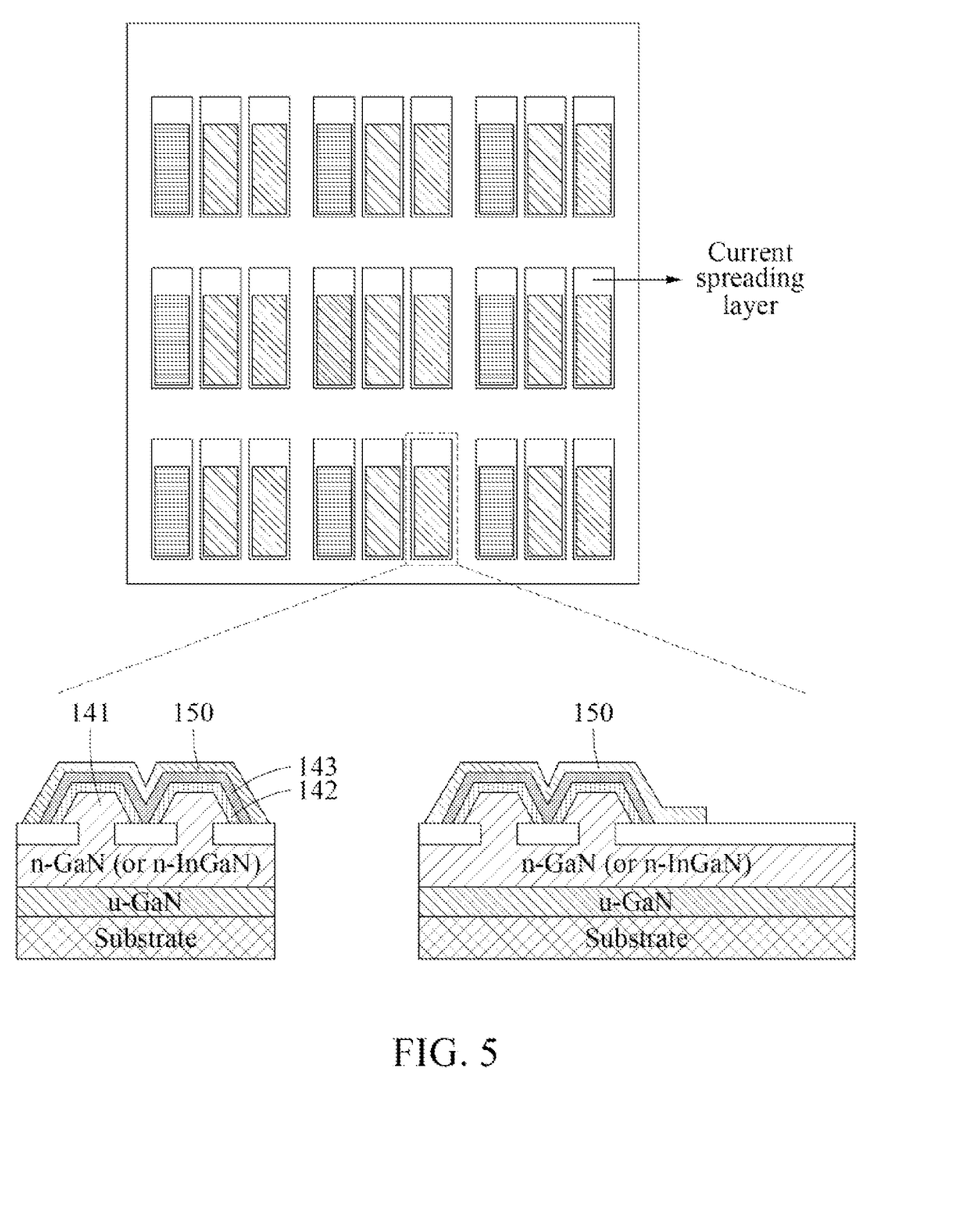
FIG. 5 illustrates an example of a step of forming a current spreading layer in a method of manufacturing a micro-LED-based display according to an example embodiment.

Referring to FIG. 5, the current spreading layer 150 may be formed along the surface of the 3D light emitting structure 140, or may be further extended toward the 3D light emitting structure 140, for injection of current to the TFT and electrical connection based on a position of the 3D light emitting structure 140 in a micro-LED region.

For example, the current spreading layer 150 may be a uniform and conformal layer extended toward the TFT region or formed on the p-type semiconductor layer 143 based on a shape of the p-type semiconductor layer 143.

Figure 6:
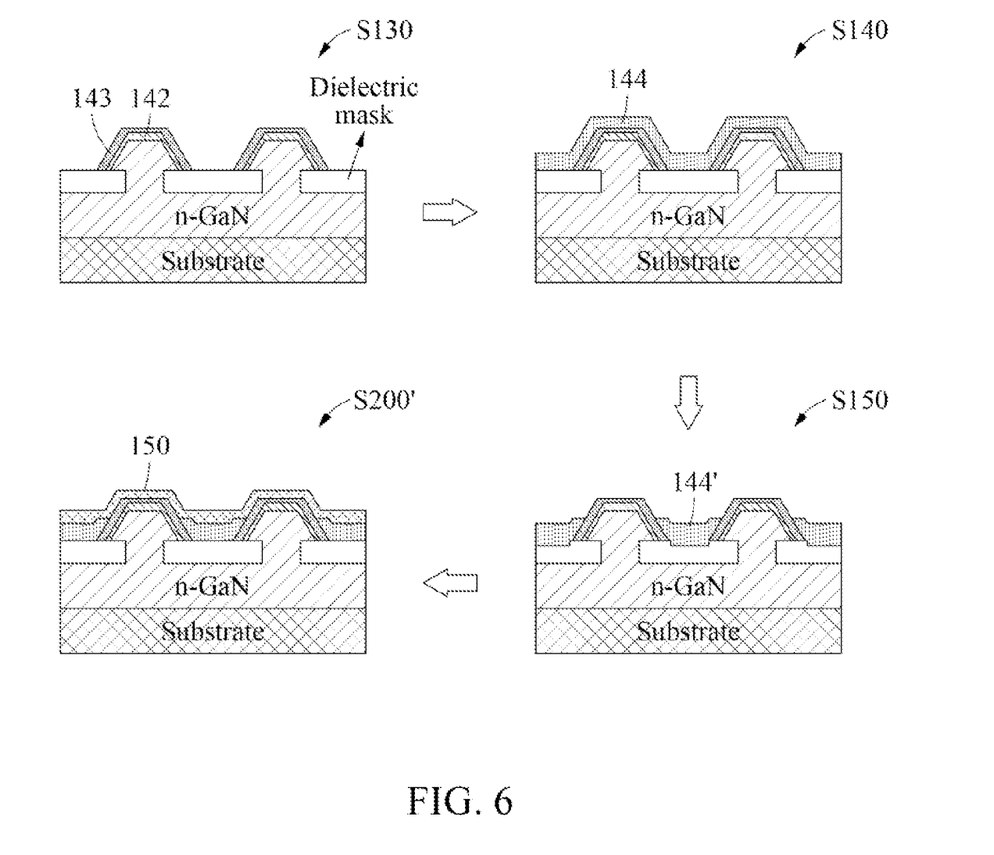
FIG. 6 illustrates an example of a step of forming a leakage current blocking layer in a method of manufacturing a micro-LED-based display according to an example embodiment.

Referring to FIG. 6, step S140 of forming a leakage current blocking layer on at least a portion of the micro-LED, and step S200' of forming a current spreading layer on the micro-LED may be included.

Step S140 may be performed to form leakage current blocking layers 144 and 144' on the p-type semiconductor layer 143 of the micro-LED for effective current injection.

In an example, a leakage current blocking layer may be formed at a predetermined height in a lower region so that an upper region of a micro-LED, that is, an upper region of a 3D light emitting structure on which a p-type semiconductor layer is formed may be exposed. In another example, a leakage current blocking layer may be formed on a bottom surface to fill a gap between 3D light emitting structures.

Selectively, step S150 of processing the leakage current blocking layer may be further included. Step S150 may be a step of processing the leakage current blocking layer 144 by etching or removing a portion of the leakage current blocking layer 144 so that an upper region of the 3D light emitting structure 140 on which the p-type semiconductor layer 143 is formed is exposed and so that the leakage current blocking layer 144 may have a desired depth and/or may be in a desired position, after the leakage current blocking layers 144 and 144' are formed. For example, when the leakage current blocking layer 144 is formed, the leakage current blocking layer 144 may be processed to form the leakage current blocking layer 144'. In other words, the leakage current blocking layer may reduce a height of a stepped portion between 3D light emitting structures so that the current spreading layer may easily cover the leakage current blocking layer. Also, the leakage current blocking layer may include an insulating layer to block leaking current. When the upper region of the 3D light emitting structure is exposed, the p-type semiconductor layer and the current spreading layer may come into contact with each other, which may allow current to smoothly flow.

The leakage current blocking layers 144 and 144' may have a thickness of 1 nm or greater, a thickness of 10 nm or greater, a thickness of 50 nm or greater, a thickness of 200 nm or greater, or a thickness of 1 nm to 200 nm.

The leakage current blocking layers 144 and 144' may each be a transparent layer, for example, may be transparent to a visible light region.

The leakage current blocking layers 144 and 144' may include an insulating material including at least one selected from the group consisting of an organic material, nitride, oxide, and metal. For example, any insulating material applicable to a display may be applied without a limitation, and the insulating material may include, for example, a spin-on glass (SOG) material, metal, oxide, a silicon oxide film, a silicon nitride film, organosilane, polycaprolactone, polytetrahydrofuran, epoxy, xylene glycol, polyethylene, polystyrene, polycarbonate, polyimide, a silicone-based resin, a melamine-based resin, an acrylic resin, a phenolic resin, metal alkoxide, a urethane-based resin, insulating inorganic material, or a metal material coated with an insulating material. A deposition method, such as chemical vapor deposition (CVD), plasma-enhanced chemical vapor deposition (PECVD), sputtering, or coating, may be used.

The SOG material may be a material known in the art to which the present disclosure belongs, and may include, but is not limited to, for example, at least one selected from the group consisting of siloxane, hydrogen silsequioxane (HSQ), methylsilsequioxane (MSQ), perhydropolysilazane, polysilazane, and divinylsiloxane bis-benzocyclobutane (DVS-BCB).

The metal may include, for example, at least one selected from the group consisting of siloxane Co, Ir, Ta, Cr, Mn, Mo, Tc, W, Re, Fe, Sc, Ti, Sn, Ge, Sb, Al, Pt, Ni, and Au. The nitride and oxide may include the metal, and may include, for example, $SiO_2$, SiNx, $TiO_2$, and $Al_2O_3$.

Step S200' of forming a current spreading layer on the micro-LED may be performed to form a current spreading layer on the micro-LED on which the leakage current blocking layer is formed. The current spreading layer may be formed based on a shape of each of the leakage current blocking layer and the 3D light emitting structure, or may be formed to cover the leakage current blocking layer and the 3D light emitting structure. Other configurations and processes are the same as those described in step S200. In other words, the current spreading layer may be deposited on the 3D structure partially covered by the leakage current blocking layer, and may be in contact with the p-type semiconductor. For example, 3D structures included in sub-pixel regions may be electrically connected, and current spreading layers may be deposited for each of the sub-pixels.

Step S300 may be a step of performing planarization by forming a planarization layer 160 on at least a portion of the micro-LED or over the entire micro-LED. For example, the planarization layer 160 may be formed in a region in which a TFT is integrated among micro-LED regions on the micro-LED, and the entire array in which electrical connections are differentiated by pixels by a current spreading layer may be planarized. The planarization layer 160 may be formed on the 3D light emitting structure 140 and/or in the micro-LED region along the current spreading layer 150 formed on the 3D light emitting structure 140, which may planarize a curved portion by the 3D light emitting structure to facilitate TFT deposition. Step S300 may be performed after step S200 or S200', and may be selectively omitted.

Figure 7:
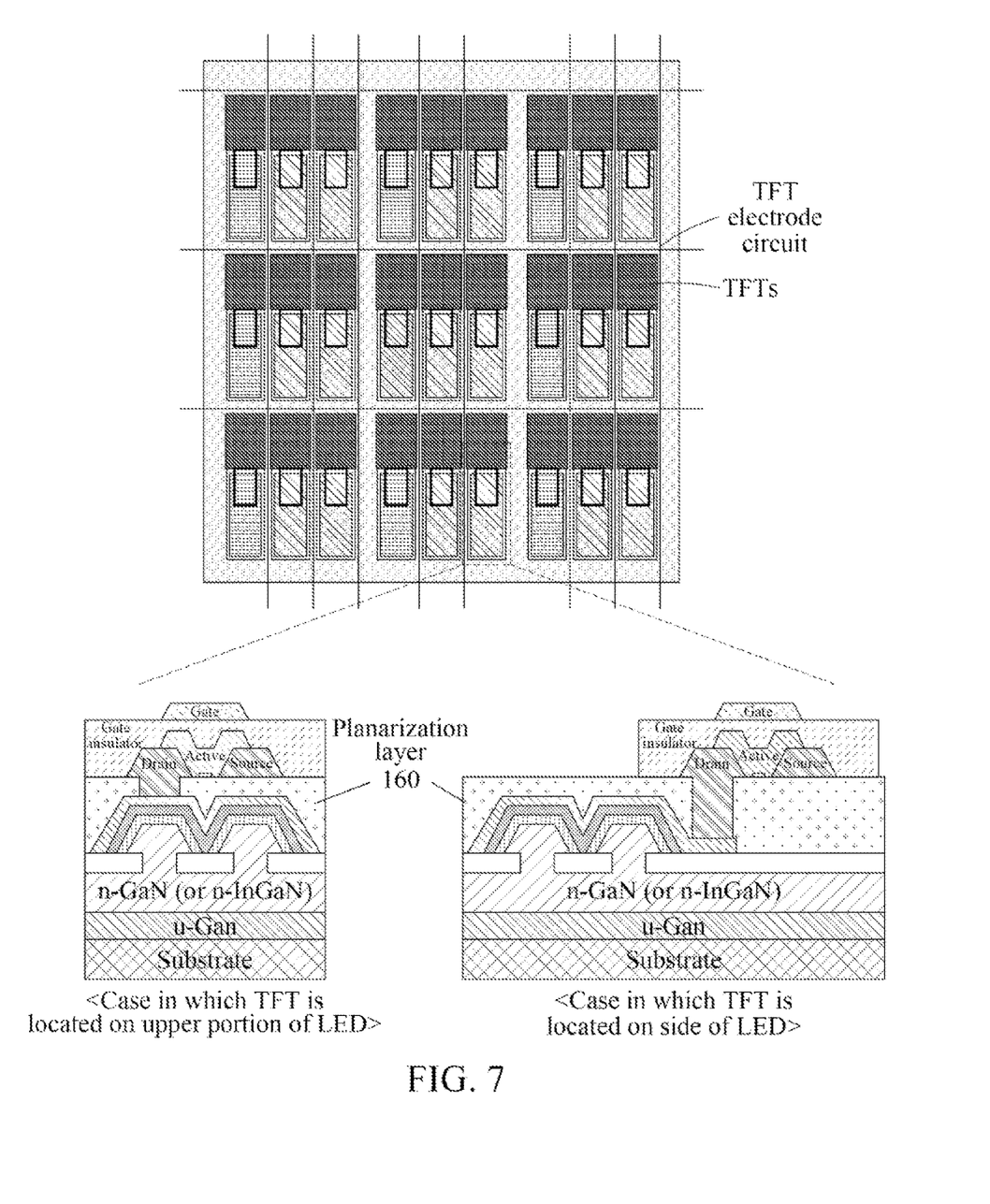
FIG. 7 illustrates an example of a step of integrating a micro-LED and a thin-film transistor (TFT) in a method of manufacturing a micro-LED-based display according to an example embodiment.

Referring to FIG. 7, the planarization layer 160 may be formed with a constant thickness on the micro-LED based on a position of a light emitting structure, by depositing an insulating layer including at least one selected from the group consisting of an organic material, nitride, oxide, and meal, and performing planarization.

For example, any insulating material applicable to a display may be applied without a limitation, and the insulating material may include, for example, an SOG material, metal, a oxide transparent material, a silicon oxide film, a silicon nitride film, organosilane, polycaprolactone, polytetrahydrofuran, epoxy, xylene glycol, polyethylene, polystyrene, polycarbonate, polyimide, a silicone-based resin, a melamine-based resin, an acrylic resin, a phenolic resin, metal alkoxide, a urethane-based resin, insulating inorganic material, or a metal material coated with an insulating material. A deposition method, such as PECVD, CVD, or sputtering may be used, and a degree of planarization may increase by chemical or mechanical polishing processes.

For example, the planarization layer 160 may include an insulating material that is the same as or different from those of the leakage current blocking layers 144 and 144', and sub-pixels may be electrically insulated from each other.

The SOG material may be a material known in the art to which the present disclosure belongs, and may include, but is not limited to, for example, at least one selected from the group consisting of siloxane, hydrogen silsequioxane (HSQ), methylsilsequioxane (MSQ), perhydropolysilazane, polysilazane, and divinylsiloxane bis-benzocyclobutane (DVS-BCB).

The metal may include, for example, at least one selected from the group consisting of Co, Ir, Ta, Cr, Mn, Mo, Tc, W, Re, Fe, Sc, Ti, Sn, Ge, Sb, Al, Pt, Ni, and Au. The nitride and oxide may include the metal, and may include, for example, $SiO_2$, SiNx, $TiO_2$, and $Al_2O_3$.

The planarization layer 160 may be a single layer or a plurality of layers. The thickness of the planarization layer 160 may change based on a shape of a layer under the planarization layer 160. For example, an inner thickness of the planarization layer 160 may change based on a height of a stepped portion between 3D structures, and a shape of a surface of the 3D structure, but a top surface of the planarization layer 160 may be flat.

The planarization layer 160 may be a transparent layer, and may be, for example, transparent to a visible light region.

Step S400 may be a step of forming a via hole 161 so that the micro-LED is exposed in the planarization layer 160 to electrically contact a TFT and the micro-LED through the via hole 161. Step S400 may be selectively omitted. Referring to FIGS. 1 and 6, the via hole 161 may be formed in an upper region or a side of the micro-LED. The via hole 161 may be formed to a depth at which the current spreading layer 150 is exposed, and a drain region of the TFT may contact the current spreading layer 150 through the via hole 161.

Referring to FIG. 7, the via hole 161 may correspond to a portion into which the drain region of the TFT is inserted, and may be formed on an upper portion or a side of a light emitting structure of a micro-LED, which may change based on a position at which the TFT is deposited.

Figure 8:
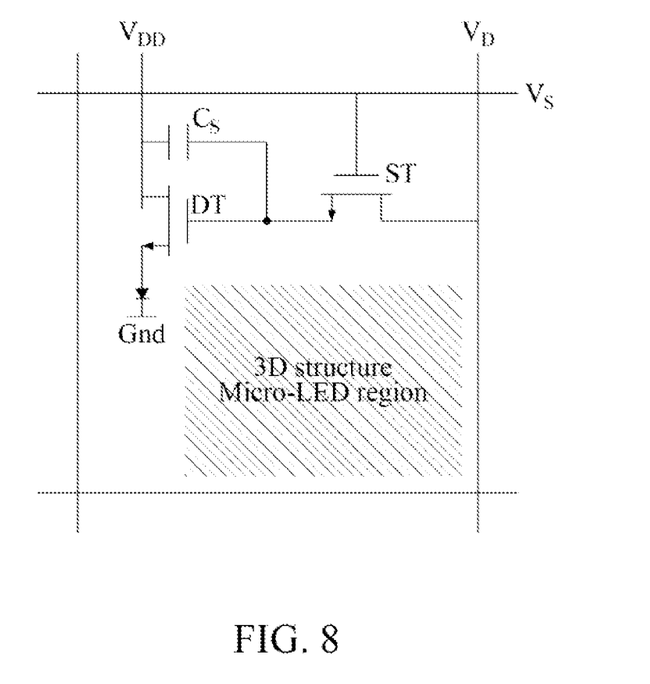
FIG. 8 illustrates an example of a TFT electrode circuit of a micro-LED-based display according to an example embodiment.

Step S500 may be a step of arranging and depositing a circuit of a TFT 170 corresponding to each sub-pixel for an operation of a 3D light emitting structure in a planarized micro-LED region, and of integrating the micro-LED and the circuit of the TFT 170. Here, TFTs may be integrated over all micro-LEDs on a substrate using a monolithic deposition process. For example, referring to FIG. 6, TFT deposition may be performed with respect to a region that is designed in advance for deposition of a TFT, and an electrode in a drain 173 of the TFT 170 may be electrically connected to the current spreading layer 150 formed on the 3D light emitting structure so that the micro-LED and the TFT may be connected, that is, integrated. Various configurations of a TFT electrode circuit may be designed based on a connection of the micro-LED and the TFT. For example, a TFT electrode circuit may be configured as shown in FIG. 8.

The TFT 170 may be a silicon-based TFT or an oxide TFT, and may have at least one silicon (Si) structure, for example, an amorphous silicon structure and a polysilicon structure, or a TFT structure with an oxide semiconductor (for example, In—O, Zn—O, Sn—O, In—Zn—O, In—Ga—Zn-O, In—Sn—Zn—O, In-Ga—Zn-O, and Al—In—Sn—Zn—O) having at least one metal component among indium, gallium, zinc, tin, and aluminum. When the TFT is deposited, a TFT deposition temperature may be in a range in which a characteristic of an organic material layer of a planarization layer is not reduced.

The TFT 170 may include a gate insulator 171, a source 172, the drain 173, an active 174, and a gate 175. Any configuration applicable to the micro-LED-based display and known in the art to which the present disclosure belongs without departing from the aspect of the present disclosure may be applicable without a limitation, and is not described in detail in the present disclosure.

Steps S100 through S500 may be performed on the same semiconductor substrate, and may not include a transferring process between the above steps (for example, the method may be free of a transferring process).

An existing micro-LED-based display is implemented using LED chips, on which processes are completed, through a complex transferring process, whereas an actively operating micro-LED-based display according to the present disclosure may be manufactured without a complex transferring scheme by forming a multi-wavelength light emitting structure by a 3D light emitting structure on a single substrate and by integrating a TFT circuit on the same substrate through a series of processes. Also, manufacturing processes of medium-, small- and large-sized displays may be simplified, and displays may be manufactured and produced in large quantities. Furthermore, when a size of a display decreases, a size of a micro-LED forming a pixel may decrease, and accordingly a level of difficulty of a process may rapidly increase. However, in the present disclosure, it is possible to lower a level of technical difficulty in manufacturing of micro-LED-based medium- and small-sized displays.

According to an example embodiment, steps S200, S300 and S500 may be performed on the same substrate through a series of deposition processes and a large-area process so that a micro-LED and a TFT may be integrated and that one of processes may be selectively omitted or may be changed based on an order of processes or a position of a thin film (for example, a micro-LED).

According to an example embodiment, the sub-pixel may be, for example, a micro-LED that emits at least one of red, green and blue lights, or a micro-LED that emits white light, light having a broadband wavelength, or both. As shown in FIG. 8, a wavelength of light to be emitted may be adjusted by the semiconductor layer 120 and the light emitting layer 142. For example, an n-GaN semiconductor layer may be applied to form wavelengths of red, green and blue lights to be emitted, and an n-INGaN semiconductor layer may be applied to form a wavelength of white light or a broadband wavelength.

Also, a micro-LED that emits white light, light having a broadband wavelength, or both may use a color filter to realize red, green, blue (RGB) colors. In other words, step S600 of depositing a color filter may be further included after step S500. A wavelength of light to be emitted by a sub-pixel of a micro-LED may be adjusted by the color filter. For example, in a configuration of a micro-LED that emits white light or light having a broadband wavelength, RGB colors may be realized, and a color quality may also be enhanced.

Figure 9:
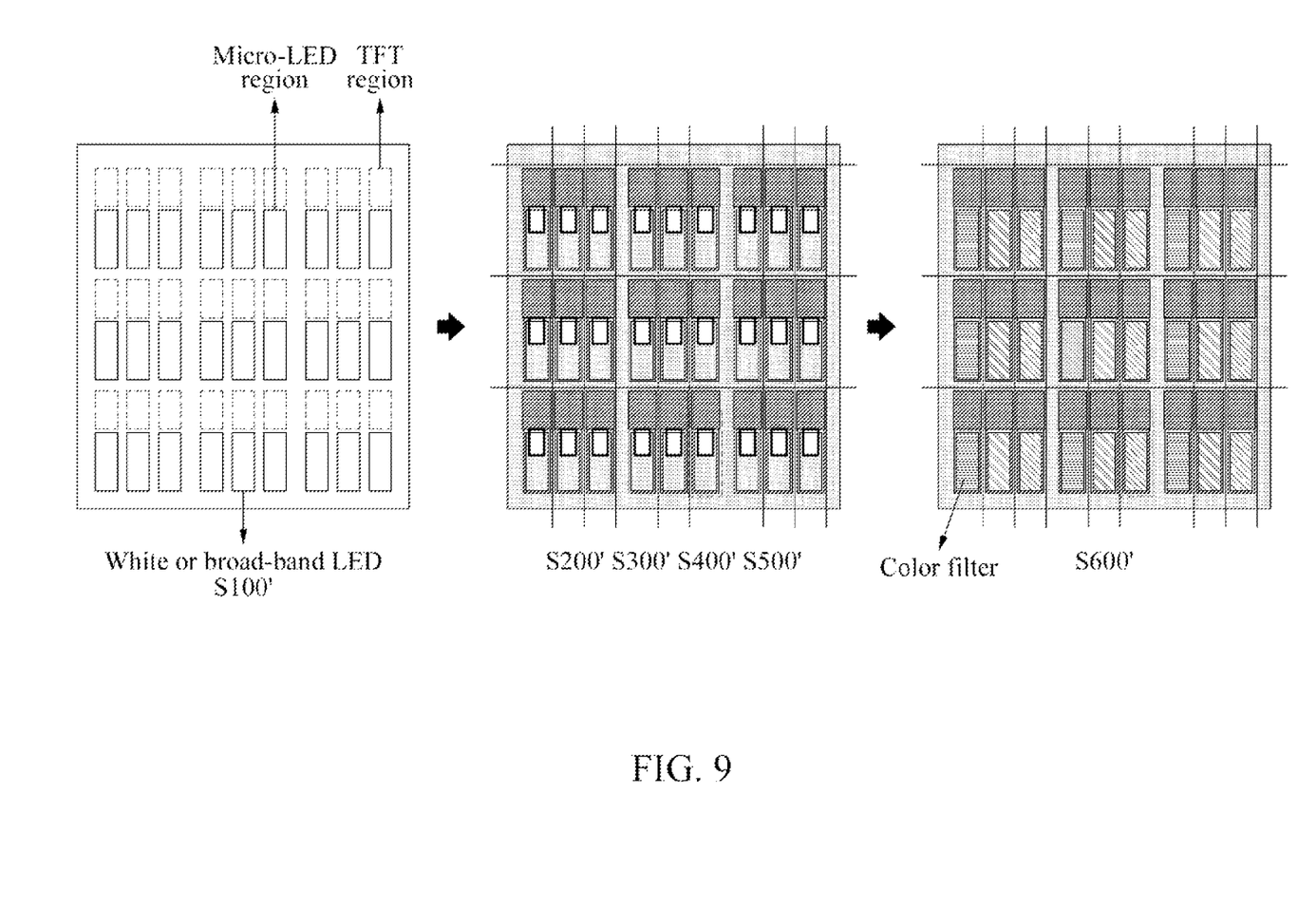
FIG. 9 illustrates another example of a method of manufacturing a micro-LED-based display according to an example embodiment.

For example, referring to FIG. 9, step S100' of forming a micro-LED that emits white light, light having a broadband wavelength, or both, step S300' of performing planarization, step S400' of forming a via hole, step S500' of integrating the micro-LED and a TFT, and step S600' of depositing a color filter may be included. Step S200' of forming a current spreading layer may be further included. Each of the above steps may be selectively omitted, or an order of the steps may be changed.

According to an example embodiment, to operate a display according to the present disclosure, a process of introducing and/or forming a configuration typically applicable in a technical field of the present disclosure may be further included, and a step of forming an electrode layer may be further included, for example. The electrode layer may include, for example, a p-type electrode layer and/or an n-type electrode layer. The p-type electrode layer may include transparent semiconductor oxide, metal, or both, and may include, for example, at least one selected from the group consisting of Co, Ir, Ta, Cr, Mn, Mo, Tc, W, Re, Fe, Sc, Ti, Sn, Ge, Sb, Al, Pt, Ni, Au, indium tin oxide (ITO), indium zinc oxide (IZO), zinc oxide (ZnO), indium zinc tin oxide (IZTO), cadmium stannate (CTO), poly(3,4-ethylene-dioxythiophene) (PEDOT), and CNTs. The n-type electrode layer may include, for example, at least one selected from the group consisting of Co, Ir, Ta, Cr, Mn, Mo, Tc, W, Re, Fe, Sc, Ti, Sn, Ge, Sb, Al, Pt, Ni, Au, ITO, and ZnO. The n-type electrode layer may be formed as a single layer, or a plurality of layers.

According to an example embodiment, a micro-LED-based display may be provided. The micro-LED-based display may be manufactured by the above-described method by forming a micro-LED on a same substrate and performing integration using a monolithic TFT process.

The micro-LED-based display may provide a polychromatic wavelength, high-quality and full-color display. In other words, in the micro-LED-based display, a 3D structure micro-LED that is partitioned in the unit of sub-pixels and that have light emitting regions emitting red, green and blue lights may be formed and integrated with a TFT, and each of the light emitting regions may be divided into sub-pixels, to implement a multi-color micro-LED-based color or full-color display.

For example, a 3D light emitting structure having a spectrum of white light or light with a broadband wavelength may be formed as each sub-pixel, may be integrated with a TFT, and a color filter may be deposited, to implement red, green and blue sub-pixels.

A micro-LED-based display according to an example embodiment may be applicable to a large-sized display in addition to medium- and small-sized displays while the micro-LED-based display is being used in a device such as a smartphone, a vehicle display, or a smartwatch, and may replace an organic light emitting diode (OLED)-based display and a liquid crystal display (LCD).

While a few example embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements are combined or coupled in different forms and modes than as described above or be substituted or switched to with other components or equivalents. Thus, other implementations, alternative embodiments and equivalents to the claimed subject matter are construed as being within the appended claims.

The invention claimed is:

1. A method of manufacturing a micro-light emitting diode (LED)-based display, the method comprising:
   forming a micro-LED partitioned in the unit of a plurality of sub-pixels in a micro-LED region of a semiconductor substrate;
   forming a current spreading layer on a p-type semiconductor layer of the micro-LED, wherein a portion of the current spreading layer extends into a thin-film transistor region (TFT region) of the semiconductor substrate, the TFT region positioned adjacent the micro-LED region,
   planarizing the micro-LED by forming a planarization layer on at least a portion of the micro-LED and on the portion of the current spreading layer that extends into the TFT region;
   forming a via hole in the planarization layer so that the portion of the current spreading layer that extends into the TFT region is exposed; and
   integrating the micro-LED and a thin-film transistor (TFT) for an operation of the sub-pixels by arranging and depositing the TFT at least partially over the TFT region and inserting a drain region of the TFT into the via hole to contact the portion of the current spreading layer that extends into the TFT region.

2. The method of claim 1, wherein the forming of the micro-LED comprises forming a micro-LED partitioned in the unit of sub-pixels on at least a portion of a single substrate through a single process.

3. The method of claim 1, wherein the forming of the micro-LED comprises:
forming a three-dimensional (3D) light emitting structure by being partitioned in the unit of sub-pixels on an n-type semiconductor layer; and
forming a p-type semiconductor layer on the 3D light emitting structure.

4. The method of claim 3, wherein the forming of the 3D light emitting structure comprises:
forming a 3D structure on the n-type semiconductor layer; and
forming a light emitting layer configured to emit broadband light or light emitting layers configured to emit light with at least two different wavelengths on the 3D structure.

5. The method of claim 4, wherein the forming of the 3D structure on the n-type semiconductor layer comprises:
forming a mask layer on the n-type semiconductor layer;
patterning the mask layer; and
forming structures having various shapes, sizes or distances by etching or growing the n-type semiconductor layer.

6. The method of claim 3, wherein
the forming of the p-type semiconductor layer comprises:
forming the p-type semiconductor layer on the 3D light emitting structure; or
forming the p-type semiconductor layer so that the 3D light emitting structure is buried, and
the p-type semiconductor layer has a thickness of 100 nanometers (nm) to 2 micrometers (μm).

7. The method of claim 3, wherein
a wavelength of light emitted from the 3D light emitting structure is adjusted by at least one of shapes, sizes and arrangement intervals of 3D structures, and
the sub-pixels comprise 3D light emitting structures configured to emit light having identical wavelengths or different wavelengths.

8. The method of claim 1, wherein the sub-pixels emit at least one of red, green and blue lights, and are formed with polychromatic wavelength micro-LEDs.

9. The method of claim 1, wherein the sub-pixels emit white light, light having a broadband wavelength, or both.

10. The method of claim 1, further comprising:
forming a leakage current blocking layer on at least a portion of the micro-LED; and
forming the current spreading layer on the portion of the micro-LED on which the leakage current blocking layer is formed,
wherein the leakage current blocking layer is formed on a p-type semiconductor layer of the micro-LED, and is formed to expose an upper region of the micro-LED, and
wherein the current spreading layer is formed on the leakage current blocking layer and the p-type semiconductor layer.

11. The method of claim 10, wherein the leakage current blocking layer comprises an insulating material comprising at least one selected from the group consisting of an organic material, metal, oxide, nitride, and metal, and is transparent to visible light.

12. The method of claim 1, wherein the current spreading layer has a thickness of 1 nm to 500 nm, and is formed as a single layer or a plurality of layers.

13. The method of claim 1, wherein the current spreading layer comprises a transparent electrode layer with a thickness of 1 nm to 500 nm, a metal electrode layer with a thickness of 1 nm to 50 nm, or both.

14. The method of claim 1, wherein the planarizing of the micro-LED comprises depositing an insulating layer comprising at least one selected from the group consisting of an organic material, oxide, nitride, and metal in the TFT region in which the TFT is formed and in the micro-LED region in which the current spreading layer is formed, and performing planarization.

15. The method of claim 1, wherein the planarization layer comprises at least one of a spin-on glass (SOG) material, metal, oxide, and a nitride insulting material, and is transparent to visible light.

16. The method of claim 1, wherein
the forming of the micro-LED, and the integrating of the micro-LED and the TFT are performed on a same semiconductor substrate, and
the method is free of a transferring process between the forming of the micro-LED, and the integrating of the micro-LED and the TFT.

17. The method of claim 1, further comprising depositing a color filter corresponding to each of the sub-pixels.

* * * * *